(12) United States Patent
Jiang et al.

(10) Patent No.: US 11,538,833 B2
(45) Date of Patent: Dec. 27, 2022

(54) DISPLAY SUBSTRATE HAVING BONDING AREA FOR BONDING WITH CIRCUIT STRUCTURE, DISPLAY APPARATUS, AND CIRCUIT STRUCTURE HAVING BONDING AREA FOR BONDING WITH DISPLAY SUBSTRATE

(71) Applicants: Chengdu BOE Optoelectronics Technology Co., Ltd., Sichuan (CN); BOE Technology Group Co., Ltd., Beijing (CN)

(72) Inventors: Yichen Jiang, Beijing (CN); Biyu Zhao, Beijing (CN); Jianjun Wu, Beijing (CN); Jiangsheng Wang, Beijing (CN); Zewen Li, Beijing (CN)

(73) Assignees: BOE Technology Group Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 328 days.

(21) Appl. No.: 16/484,763

(22) PCT Filed: Dec. 6, 2018

(86) PCT No.: PCT/CN2018/119546
§ 371 (c)(1),
(2) Date: Aug. 8, 2019

(87) PCT Pub. No.: WO2020/052114
PCT Pub. Date: Mar. 19, 2020

(65) Prior Publication Data
US 2021/0358959 A1  Nov. 18, 2021

(30) Foreign Application Priority Data
Sep. 13, 2018  (CN) .......................... 201811068860.3

(51) Int. Cl.
*H01L 27/12* (2006.01)
*G06F 3/041* (2006.01)
*G09G 3/20* (2006.01)

(52) U.S. Cl.
CPC ........ *H01L 27/124* (2013.01); *G06F 3/04164* (2019.05); *G09G 3/20* (2013.01); *G09G 2300/0426* (2013.01)

(58) Field of Classification Search
CPC ..... H01L 27/124; G06F 3/04164; G09G 3/20; G09G 2300/0426
See application file for complete search history.

(56) References Cited

U.S. PATENT DOCUMENTS

| 7,323,712 B2 * | 1/2008 | Kokubo | H01R 13/2414 |
| | | | 324/754.11 |
| 2002/0105078 A1 * | 8/2002 | Lee | H01L 23/16 |
| | | | 257/773 |

(Continued)

FOREIGN PATENT DOCUMENTS

| CN | 103809344 A | 5/2014 |
| CN | 106206614 A | 12/2016 |

(Continued)

OTHER PUBLICATIONS

International Search Report & Written Opinion dated May 31, 2019, regarding PCT/CN2018/119546.

*Primary Examiner* — Patrick N Edouard
*Assistant Examiner* — Eboni N Giles
(74) *Attorney, Agent, or Firm* — Intellectual Valley Law, P.C.

(57) ABSTRACT

A display substrate having a bonding area for bonding with a circuit structure. The display substrate includes a plurality of first electrodes and a plurality of second electrodes in the bonding area, a respective one of the plurality of first electrodes being bound to a respective one of the plurality of (Continued)

second electrodes thereby forming a respective pair of a plurality of bound electrode pairs in the bonding area; a barrier layer including a plurality of barriers respectively between adjacent pairs of the plurality of bound electrode pairs; and an anisotropic conductive film for bonding the respective one of the plurality of first electrodes and the respective one of the plurality of second electrodes together.

15 Claims, 8 Drawing Sheets

(56) References Cited

U.S. PATENT DOCUMENTS

| 2014/0118912 | A1 | 5/2014 | Wu et al. |
| 2016/0143174 | A1* | 5/2016 | Cho ................. H05K 1/181 |
| | | | 174/251 |
| 2019/0129472 | A1 | 5/2019 | Luo et al. |
| 2019/0361306 | A1* | 11/2019 | Kim ................. G02F 1/13624 |

FOREIGN PATENT DOCUMENTS

| CN | 107658320 A | 2/2018 |
| CN | 108333840 A | 7/2018 |
| JP | 2003045236 A | 2/2003 |
| TW | 479304 B | 3/2002 |

\* cited by examiner

DISPLAY SUBSTRATE HAVING BONDING AREA FOR BONDING WITH CIRCUIT STRUCTURE, DISPLAY APPARATUS, AND CIRCUIT STRUCTURE HAVING BONDING AREA FOR BONDING WITH DISPLAY SUBSTRATE

CROSS-REFERENCE TO RELATED APPLICATION

This application is a national stage application under 35 U.S.C. § 371 of International Application No. PCT/CN2018/119546, filed Dec. 6, 2018, which claims priority to Chinese Patent Application No. 201811068860.3, filed Sep. 13, 2018, the contents of which are incorporated by reference in the entirety.

TECHNICAL FIELD

The present invention relates to display technology, more particularly, to a display substrate having a bonding area for bonding with a circuit structure, a display apparatus, and a circuit structure having a bonding area for bonding with a display substrate.

BACKGROUND

In display apparatuses, an integrated circuit chip may be mounted to the display apparatus by various technique, including a chip-on-glass (COG) technique, a chip-on-film (COF) technique, and a chip-on-plastic (COP) technique. In the COF technique, the integrated circuit chip is mounted on a film, which then couples a flexible display apparatus and a flexible printed circuit board (FPCB). In the COP technique, the integrated circuit chip is directly mounted on a plastic base substrate of the flexible display apparatus. The COP technique does not utilize the film used in the COF technique, thereby reducing the cost.

SUMMARY

In one aspect, the present invention provides a display substrate having a bonding area for bonding with a circuit structure, comprising a plurality of first electrodes and a plurality of second electrodes in the bonding area, a respective one of the plurality of first electrodes being bound to a respective one of the plurality of second electrodes thereby forming a respective pair of a plurality of bound electrode pairs in the bonding area; a barrier layer comprising a plurality of barriers respectively between adjacent pairs of the plurality of bound electrode pairs; and an anisotropic conductive film for bonding the respective one of the plurality of first electrodes and the respective one of the plurality of second electrodes together.

Optionally, the anisotropic conductive film comprises a first part between the respective one of the plurality of first electrodes and the respective one of the plurality of second electrodes in the respective pair of a plurality of bound electrode pairs.

Optionally, the anisotropic conductive film further comprises a second part filling a respectively one of a plurality of gaps respectively between adjacent pairs of the plurality of bound electrode pairs other than a space occupied by the barrier layer.

Optionally, the anisotropic conductive film comprises a second part continuously extending through a respectively one of a plurality of gaps respectively between adjacent pairs of the plurality of bound electrode pairs.

Optionally, the display substrate further comprises a first base substrate and a second base substrate facing each other; wherein the plurality of first electrodes are on the first base substrate; the plurality of second electrodes are on the second base substrate; and an orthographic projection of the second part of the anisotropic conductive film in the respectively one of the plurality of gaps on the first base substrate covers an orthographic projection of a respective one of the plurality of barriers in the respectively one of the plurality of gaps on the first base substrate.

Optionally, the display substrate further comprises a first base substrate and a second base substrate facing each other; wherein the plurality of first electrodes are on the first base substrate; the plurality of second electrodes are on the second base substrate; and a distance between the first base substrate and the second base substrate along a direction perpendicular to the first base substrate is greater than a thickness of the barrier layer in the respectively one of the plurality of gaps along the direction perpendicular to the first base substrate.

Optionally, the respective one of the plurality of barriers in the respectively one of the plurality of gaps is spaced apart from the adjacent pairs of the plurality of bound electrode pairs by the anisotropic conductive film.

Optionally, a width of the respective one of the plurality of barriers in the respectively one of the plurality of gaps along a direction across the adjacent pairs of the plurality of bound electrode pairs is in a range of approximately ⅓ to approximately ½ of a width of the respectively one of the plurality of gaps along the direction across the adjacent pairs of the plurality of bound electrode pairs.

Optionally, the display substrate further comprises a first base substrate and a second base substrate facing each other, wherein the plurality of first electrodes are on the first base substrate; the plurality of second electrodes are on the second base substrate; and the plurality of barriers are respectively in direct contact with the first base substrate.

Optionally, a respective one of the plurality of barriers is in direct contact with adjacent first electrodes of the plurality of first electrodes; and a thickness of the respective one of the plurality of barriers in the respectively one of the plurality of gaps along a direction perpendicular to the first base substrate is equal to or less than a distance between a side of the first part of the anisotropic conductive film away from the first base substrate and the first base substrate along the direction perpendicular to the first base substrate.

Optionally, the display substrate further comprises a first base substrate and a second base substrate facing the first base substrate; wherein the plurality of first electrodes are on the first base substrate; the plurality of second electrodes are on the second base substrate; and the plurality of barriers comprise a plurality of first barriers respectively in direct contact with the first base substrate and a plurality of second barriers respectively in direct contact with the second base substrate.

Optionally, the plurality of first barriers and the plurality of second barriers are alternately in the plurality of gaps respectively; and any of the plurality of first barriers and any of the plurality of second barriers are in different gaps of the plurality of gaps.

Optionally, a respective one of the plurality of first barriers and a respective one of the plurality of second barriers are in a same gap of the plurality of gaps; and orthographic projections of the respective one of the plurality of first barriers and the respective one of the plurality of second barriers in the same gap of the plurality of gaps at least partially overlap with each other.

Optionally, a respective one of the plurality of barriers is a single block; a longitudinal dimension of the single block is substantially parallel to a longitudinal dimension of a respective one of the plurality of first electrodes; and the longitudinal dimension of the single block is substantially the same as the longitudinal dimension of the respective one of the plurality of first electrodes.

Optionally, a respective one of the plurality of barriers comprises a plurality of sub-blocks spaced apart from each other; and the plurality of sub-blocks are arranged along a direction substantially parallel to a longitudinal dimension of a respective one of the plurality of first electrodes.

Optionally, the barrier layer is made of an insulating material.

Optionally, the display substrate further comprises a first base substrate and a second base substrate facing the first base substrate; wherein the plurality of first electrodes are on the first base substrate; the plurality of second electrodes am on the second base substrate; and the first base substrate and the second base substrate are two different ones selected from a group consisting of a back plate of an array substrate or a touch substrate, a base substrate of a driver integrated circuit, and a base substrate of a chip-on-film.

In another aspect, the present invention provides a display apparatus, comprising the display substrate described herein or fabricated by a method described herein.

In another aspect, the present invention provides a display substrate having a bonding area for bonding with a circuit structure, comprising a first base substrate; a plurality of first electrodes on the first base substrate and spaced apart from each other; and a barrier layer comprising a plurality of barriers respectively between adjacent first electrodes of the plurality of first electrodes.

In another aspect, the present invention provides a circuit structure having a bonding area for bonding with a display substrate, comprising a second base substrate; a plurality of second electrodes on the second base substrate and spaced apart from each other, and a barrier layer comprising a plurality of barriers respectively between adjacent second electrodes of the plurality of second electrodes.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1A:
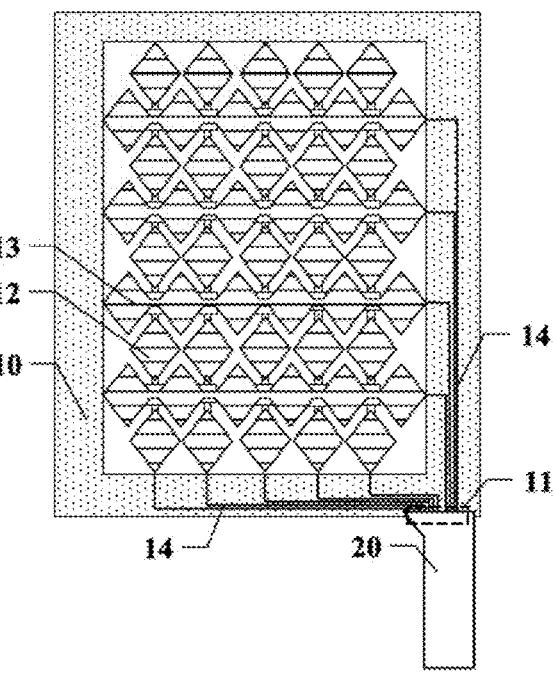
FIG. 1A is a schematic diagram illustrating a partial structure of a touch substrate in some embodiments according to the present disclosure.

FIG. 1A is a schematic diagram illustrating a partial structure of a touch substrate in some embodiments according to the present disclosure. Referring to FIG. 1A, the touch substrate in some embodiments includes a plurality of touch scanning electrodes 12 and a plurality of touch sensing electrodes 13 on a back plate 10, the plurality of touch scanning electrodes 12 and the plurality of touch sensing electrodes 13 crossing over each other. The touch substrate further includes a plurality of lead wires 14 respectively connecting the plurality of touch scanning electrodes 12 and the plurality of touch sensing electrodes 13 to a flexible printed circuit board 20.

Figure 1B:
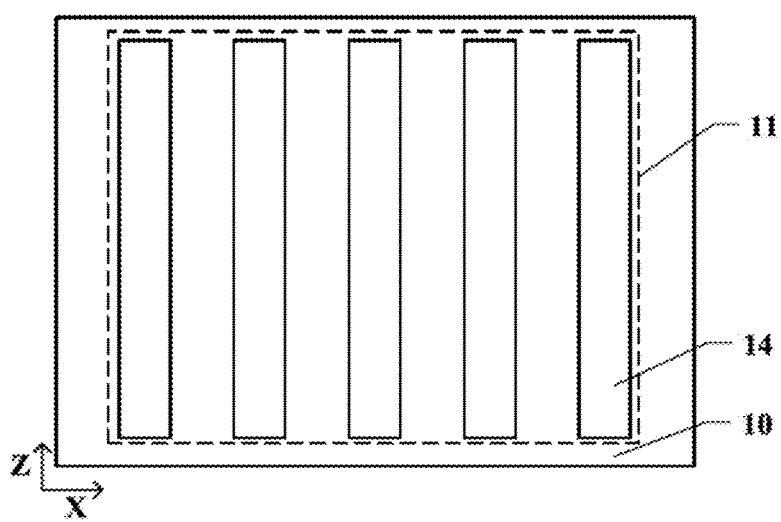
FIG. 1B is a plan view of a partial structure of the touch substrate of FIG. 1A.

FIG. 1B is a plan view of a partial structure of the touch substrate of FIG. 1A. Referring to FIG. 1B, the touch substrate has a bonding area 11, and includes the plurality of lead wires 14 on the back plate 10 for mounting a flexible printed circuit board in the bonding area 11.

Figure 1C:
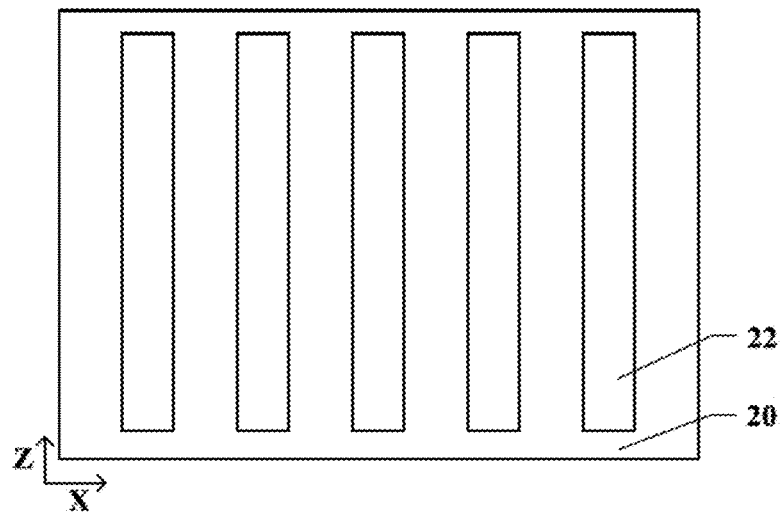
FIG. 1C illustrates the structure of a flexible printed circuit board in some embodiments according to the present disclosure.

FIG. 1C illustrate the structure of a flexible printed circuit board in some embodiments according to the present disclosure. Referring to FIG. 1C, the flexible printed circuit board 20 includes a plurality of bonding pads 22 on a side of the flexible printed circuit board 20 facing the back plate 10.

Figure 1D:
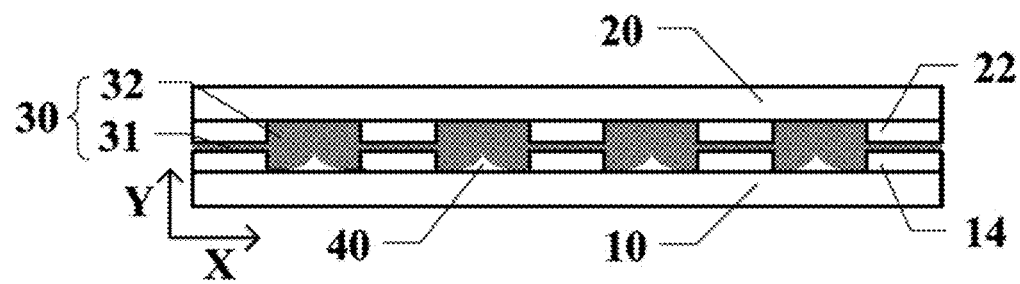
FIG. 1D is a cross-sectional view of a bonding area of a display substrate in some embodiments according to the present disclosure.

FIG. 1D is a cross-sectional view of a bonding area of a display substrate in some embodiments according to the present disclosure. Referring to FIG. 1D, the touch substrate in some embodiments further includes an anisotropic conductive film 30 for bonding with the plurality of bonding pads 22 on the flexible printed circuit board 20 with the plurality of lead wires 14 on the back plate 10. As shown in FIG. 1D, a respective one of the plurality of lead wires 14 is electrically connected to a respective one of the plurality of bonding pads 22 through the anisotropic conductive film 30. In the process of bonding the flexible printed circuit board 20 onto the back plate 10, an anisotropic conductive adhesive of the anisotropic conductive film 30 overflows into the gaps between adjacent bonding pads of the plurality of bonding pads 22. For example, the anisotropic conductive film 30 includes a conductive part 31 between a respective one of the plurality of lead wires 14 and a respective one of the plurality of bonding pads 22, and a bonding part 32 between adjacent bonding pads of the plurality of bonding pads 22.

It is discovered in the present disclosure that, after the flexible printed circuit board 20 is mounted onto the back plate 10, often the anisotropic conductive adhesive material of the anisotropic conductive film 30 is unable to completely fill the gap between adjacent bonding pads of the plurality of bonding pads 22, thereby creating an unfilled void 40 as shown in FIG. 1D. Due to the presence of the unfilled void 40, the bonding area of the touch substrate is prone to corrosion caused by external environment such as salt mist, which weakens the adhesion ability of the anisotropic conductive film 30 and leads to crack and opening in the anisotropic conductive film 30.

Salt mist corrosion is a common and highly destructive atmospheric corrosion. The salt mist corrodes the surface of metal materials through an electrochemical reaction between chloride ion and the metal. The chloride ions may penetrate through the oxide layer and the protective layer on the surface of the metal material. The chloride ions have certain hydration energy, and are prone to adhere onto pores and cracks on the surface of the metal material. The chloride ions adhered onto the surface of the metal material displaces and replaces oxygen element in the oxide layer on the surface of the metal material, converting insoluble metal oxide into soluble metal chloride and an inert surface into an active surface. The bonding part 32 of the anisotropic conductive film 30 in the gap between adjacent bonding pads of the plurality of bonding pads, when covering the surface of the gap, can prevent corrosion caused by the salt mist on metal electrodes in the bonding area.

In some embodiments, to prevent salt mist corrosion, an increased amount of the anisotropic conductive adhesive material may be used to ensure the gap is completely filled by the anisotropic conductive adhesive material. However, the relative viscosity of the anisotropic conductive adhesive material typically first decreases then increases at the reaction temperature for the anisotropic conductive adhesive material. The increased relative viscosity of the anisotropic conductive adhesive material makes it flow. Moreover, when the reaction temperature or curing duration is insufficient, the anisotropic conductive adhesive material is not fully cured, this often results in that the gap between the adjacent bonding pads not being filled, even with the increased amount of the anisotropic conductive adhesive material is used.

Accordingly, the present disclosure provides, inter alia, a display substrate having a bonding area for bonding with a circuit structure, a display apparatus, and a circuit structure having a bonding area for bonding with a display substrate that substantially obviate one or more of the problems due to limitations and disadvantages of the related art. In one aspect, the present disclosure provides a display substrate having a bonding area for bonding with a circuit structure. In some embodiments, the display substrate includes a plurality of first electrodes and a plurality of second electrodes in the bonding area, a respective one of the plurality of first electrodes being bound to a respective one of the plurality of second electrodes thereby forming a respective pair of a plurality of bound electrode pairs in the bonding area; a barrier layer comprising a plurality of barriers respectively between adjacent pairs of the plurality of bound electrode pairs; and an anisotropic conductive film for bonding the respective one of the plurality of first electrodes and the respective one of the plurality of second electrodes together. In the present display substrate, the barrier wall can reduce occurrence of unfilled void in the gaps between adjacent pairs of the plurality of bound electrode pairs. The elimination of unfilled void can effectively prevent the salt mist from penetrating into the gaps. Moreover, the amount of anisotropic conductive adhesive material can be reduced in fabricating the display substrate, reducing the manufacturing costs.

Figure 2A:
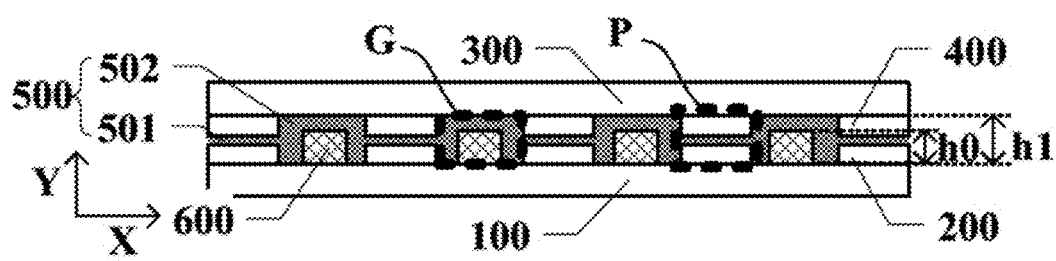
FIG. 2A is a cross-sectional view of a bonding area of a display substrate in some embodiments according to the present disclosure.
Figure 2B:
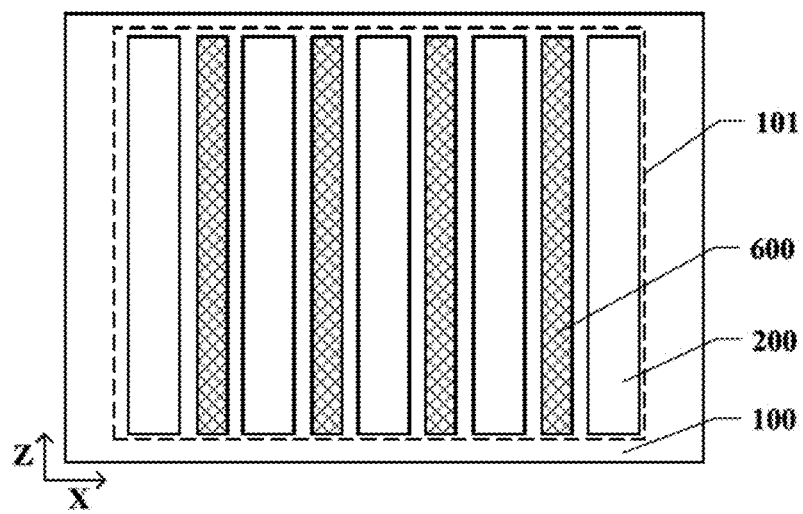
FIG. 2B is a plan view of a partial structure of a bonding area of a display substrate of FIG. 2A.
Figure 2C:
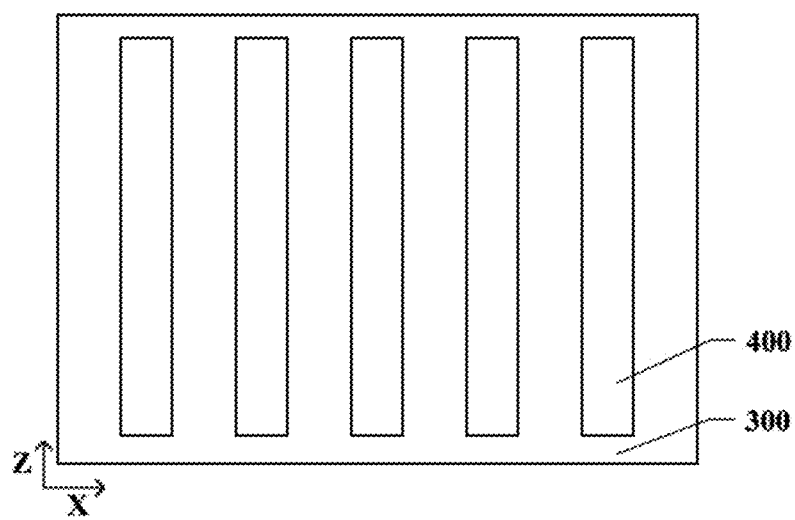
FIG. 2C is a plan view of a partial structure of a bonding area of a display substrate of FIG. 2A.

FIG. 2A is a cross-sectional view of a bonding area of a display substrate in some embodiments according to the present disclosure. FIG. 2B is a plan view of a partial structure of a bonding area of a display substrate of FIG. 2A. FIG. 2C is a plan view of a partial structure of a bonding area of a display substrate of FIG. 2A. Referring to FIGS. 2A to 2C, the display substrate in some embodiments includes a plurality of first electrodes 200 and a plurality of second electrodes 400 in a bonding area 101, and a barrier layer including a plurality of barriers 600. A respective one of the plurality of first electrodes 200 is bound to a respective one of the plurality of second electrodes 400 thereby forming a respective pair of a plurality of bound electrode pairs P in the bonding area 101. The plurality of barriers 600 are respectively between adjacent pairs of the plurality of bound electrode pairs P. The display substrate further includes an anisotropic conductive film 500 for bonding the respective one of the plurality of first electrodes 200 and the respective one of the plurality of second electrodes 400 together.

Optionally, the display substrate further includes a first base substrate 100 and a second base substrate 300 facing each other. The plurality of first electrodes 200 are on the first base substrate 100 (e.g., in the bonding area 101), and the plurality of second electrodes 400 are on the second base substrate 300. The plurality of first electrodes 200 and the plurality of second electrodes 400 are between the first base substrate 100 and the second base substrate 300.

Optionally, the plurality of first electrodes 200 are arranged along a second direction (a X-direction in FIGS. 2A to 2C), each of the plurality of first electrodes 200 extending substantially along a first direction (a Z-direction in FIG. 2B and FIG. 2C). Optionally, the first direction and the second direction are perpendicular to each other. Optionally, the plurality of second electrodes 400 are arranged along a second direction (a X-direction in FIGS. 2A to 2C), each of the plurality of second electrodes 400 extending substantially along a first direction (a Z-direction in FIG. 2B and FIG. 2C). Optionally, the first direction and the second direction are perpendicular to each other. Optionally, a respective one of the plurality of first electrodes 200 is a rod electrode. Optionally, a respective one of the plurality of second electrodes 400 is a rod electrode.

The plurality of second electrodes 400 are respectively bonded to the plurality of first electrodes 200 in the bonding area 101 through the anisotropic conductive film 500. A respective one of the plurality of second electrodes 400 is bonded to a respective one of the plurality of first electrodes 200 through the anisotropic conductive film 500. Optionally, an orthographic projection of the respective one of the plurality of second electrodes 400 on the first base substrate 100 at least partially overlaps with an orthographic projection of the respective one of the plurality of first electrodes 200 on the first base substrate 100.

In some embodiments, a respective one of the plurality of barriers 600 is between adjacent pairs of the plurality of bound electrode pairs P. Optionally, the respective one of the plurality of barriers 600 is between adjacent electrodes of the plurality of first electrodes 200. Optionally, the respective one of the plurality of barriers 600 is between adjacent electrodes of the plurality of second electrodes 400. Optionally, an orthographic projection of the respective one of the plurality of barriers 600 on the first base substrate 100 is between orthographic projections of the adjacent electrodes of the plurality of first electrodes 200 on the first base substrate 100. Optionally, an orthographic projection of the respective one of the plurality of barriers 600 on the second base substrate 300 is between orthographic projections of the adjacent electrodes of the plurality of second electrodes 400 on the second base substrate 300.

In some embodiments, the anisotropic conductive film 500 includes a first part 501 between the respective one of the plurality of first electrodes 200 and the respective one of the plurality of second electrodes 400 in the respective pair of a plurality of bound electrode pairs P. Optionally, the anisotropic conductive film 500 further includes a second part 502 filling a respectively one of a plurality of gaps G respectively between adjacent pairs of the plurality of bound electrode pairs P other than a space occupied by the barrier layer. The first part 501 is a part for electrically connecting the respective one of the plurality of first electrodes 200 and the respective one of the plurality of second electrodes 400 in the respective pair of a plurality of bound electrode pairs P. In one example, the second part 502 is in a space formed by a respective one of the plurality of barriers 600, the second base substrate 300, and two adjacent pairs of the plurality of bound electrode pairs P. Optionally, a respective one of the plurality of gaps G is in a space formed by the first base substrate 100, the second base substrate 300, two adjacent pairs of the plurality of bound electrode pairs P, and two adjacent ones of the first part 501 respectively connecting electrodes in the two adjacent pairs of the plurality of bound electrode pairs P. The second part 502 is in the respective one of the plurality of gaps G other than the space occupied by the barrier layer (e.g., a respective one of the plurality of barriers 600).

In some embodiments, the second part 502 continuously extends through a respectively one of a plurality of gaps G respectively between adjacent pairs of the plurality of bound electrode pairs P. For example, the first part 501 in a first bound electrode pairs of the plurality of bound electrode pairs P is connected to the first part 501 in and adjacent second bound electrode pairs of the plurality of bound electrode pairs P through the second part 502. The respective one of the barriers 600 in the respective one of the plurality of gaps G does not block the anisotropic conductive film 500 from extending through the respective one of the plurality of gaps G. In another example, an orthographic projection of the second part 502 of the anisotropic conductive film 500 in the respectively one of the plurality of gaps G on the first base substrate 100 covers an orthographic projection of a respective one of the plurality of barriers 600 in the respectively one of the plurality of gaps G on the first base substrate 100.

As shown in FIGS. 2A to 2C, to ensure that the respective one of the barriers 600 in the respective one of the plurality of gaps G does not block the anisotropic conductive film 500 from extending through the respective one of the plurality of gaps G, and to ensure that the respective one of the barriers 600 in the respective one of the plurality of gaps G does not interfere with the bonding between the respective one of the plurality of first electrodes 200 and the respective one of the plurality of second electrodes 400, a distance h1 between the first base substrate 100 and the second base substrate 300 along a direction perpendicular to the first base substrate 100 (e.g., a Y-direction) is greater than a thickness h0 of the barrier layer (e.g., the respective one of the plurality of barriers 600) in the respectively one of the plurality of gaps G along the direction perpendicular to the first base substrate 100.

In one example, the first base substrate 100 is aback plate of a display substrate or a touch substrate (e.g., the back plate 10 as shown in FIG. 1A). Optionally, the plurality of first electrodes 200 are a plurality of lead wires (e.g., the plurality of lead wires 14 as shown in FIG. 1A). In another example, the second base substrate 300 is a base substrate of a circuit structure. Optionally, the second base substrate 300 is a base substrate of a driver integrated circuit. Optionally, the second base substrate 300 is a base substrate of a printed circuit board, such as a flexible printed circuit board (e.g., the flexible printed circuit board 20 as shown in FIG. 1A). Optionally, the second base substrate 300 is a base substrate of a chip-on-film. Optionally, the plurality of second electrodes 400 are a plurality of bonding pads (e.g., the plurality of bonding pads 22 as shown in FIG. 1C).

In another example, each of the first base substrate 100 and the second base substrate 300 is a base substrate of a circuit structure. For example, the first base substrate 100 is a base substrate of a flexible printed circuit board, and the second base substrate 300 is a base substrate of a chip-on-film.

In some embodiments, the respective one of the plurality of barriers 600 in the respectively one of the plurality of gaps G is spaced apart from the adjacent pairs of the plurality of bound electrode pairs P by the anisotropic conductive film 500 (e.g., by the second part 502 of the anisotropic conductive film 500 in a respective one of the plurality of gaps G). In one example, as shown in FIGS. 2A to 2C, the respective one of the plurality of barriers 600 is spaced apart from the adjacent pairs of the plurality of bound electrode pairs P along the second direction (e.g., the X-direction in FIG. 2A). The respective one of the plurality of barriers 600 is not in direct contact with the adjacent pairs of the plurality of bound electrode pairs P, for example, the respective one of the plurality of barriers 600 is not in direct contact with any of the plurality of first electrode 200 and not in direct contact with any of the plurality of second electrodes 400.

In some embodiments, a width of the respective one of the plurality of barriers 600 in the respectively one of the plurality of gaps G along a direction across the adjacent pairs of the plurality of bound electrode pairs P (e.g., the second direction or the X-direction) is in a range of approximately ⅓ to approximately ½ of a width of the respectively one of the plurality of gaps G along the direction across the adjacent pairs of the plurality of bound electrode pairs P. By having this width, it can be ensured that the respective one of the barriers 600 in the respective one of the plurality of gaps G does not interfere with the bonding between the respective one of the plurality of first electrodes 200 and the respective one of the plurality of second electrodes 400. Moreover, by having this width, it can be ensured that the adhesive conductive material of the anisotropic conductive film 500 can overflow from the space between the respective one of the plurality of first electrodes 200 and the respective one of the plurality of second electrodes 400 into the respective one of the plurality of gaps G during the bonding process, and that the respective one of the plurality of gaps G can be completely filled by the adhesive conductive material other than the space occupied by the respective one of the plurality of barriers 600.

In some embodiments, the barrier layer (e.g., the plurality of barriers 600) is made of an insulating material, to prevent electrical connection between the adjacent pairs of the plurality of bound electrode pairs P. Examples of appropriate insulating materials include insulating oxide materials (e.g., silicon oxide), insulating nitride materials (e.g., silicon nitride), insulating oxynitride (e.g., silicon oxynitride), polyimide, and polymethyl methacrylate.

In some embodiments, the barrier layer (e.g., the plurality of barriers 600) is made of a conductive or semi-conductive material, particularly when the respective one of the plurality of barriers 600 is sufficiently spaced apart from the adjacent pairs of the plurality of bound electrode pairs P to ensure no electrical connection between the adjacent pairs of the plurality of bound electrode pairs P.

The respective one of the plurality of barriers 600 can have any appropriate shape. For example, a cross-section of the respective one of the plurality of barriers 600 along a X-Y plane can have any appropriate shape, e.g., a rectangular shape, a square shape, a triangular shape, a trapezoidal shape, an inverted trapezoidal shape, a circular shape, a half circle, and so on.

In some embodiments, the plurality of barriers 600 are exclusively on the first base substrate 100, and on a side of the first base substrate 100 facing the second base substrate 300. In some embodiments, the plurality of barriers 600 are exclusively on the second base substrate 300, and on a side of the second base substrate 300 facing the first base substrate 100. In some embodiments, the plurality of barriers 600 include a plurality of first barriers on the first base substrate 100 and a plurality of second barriers on the second base substrate 300. As shown in FIG. 2A, the plurality of barriers 600 are exclusively on the first base substrate 100, e.g., the plurality of barriers 600 are in direct contact with the first base substrate 100.

Figure 2D:
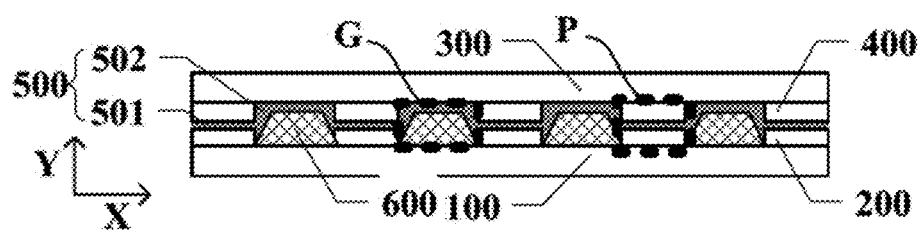
FIG. 2D is a cross-sectional view of a bonding area of a display substrate in some embodiments according to the present disclosure.

FIG. 2D is a cross-sectional view of a bonding area of a display substrate in some embodiments according to the present disclosure. Referring to FIG. 2D, in some embodiments, a portion of a respective one of the plurality of barriers 600 is in direct contact with adjacent first electrodes of the plurality of first electrodes 200. For example, a cross-section of the respective one of the plurality of barriers 600 along the X-Y plane is a trapezoidal shape, the long base of which is in direct contact with adjacent first electrodes of the plurality of first electrodes 200. However, two sides of the respective one of the plurality of barriers 600 are respectively spaced apart from the adjacent first electrodes of the plurality of first electrodes 200. For example, two sides of the trapezoidal shape are respectively spaced apart from the adjacent first electrodes of the plurality of first electrodes 200. Thus, the respective one of the plurality of barriers 600 in some embodiments is in direct contact with, and partially spaced apart from, the adjacent first electrodes of the plurality of first electrodes 200 on two sides, along the second direction, e.g., the X-direction. By having this design, it can be ensured that the adhesive conductive material of the anisotropic conductive film 500 can overflow from the space between the respective one of the plurality of first electrodes 200 and the respective one of the plurality of second electrodes 400 into the respective one of the plurality of gaps G during the bonding process, and that the respective one of the plurality of gaps G can be completely filled by the adhesive conductive material other than the space occupied by the respective one of the plurality of barriers 600. Optionally, the plurality of barriers 600 are made of an insulating material.

Figure 2E:
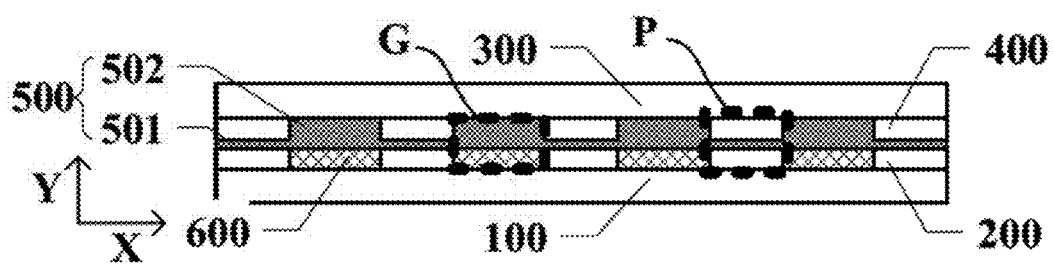
FIG. 2E is a cross-sectional view of a bonding area of a display substrate in some embodiments according to the present disclosure.

FIG. 2E is a cross-sectional view of a bonding area of a display substrate in some embodiments according to the present disclosure. Referring to FIG. 2E, a respective one of the plurality of barriers 600 is in direct contact with adjacent first electrodes of the plurality of first electrodes 200. The respective one of the plurality of barriers 600 is, however, not spaced apart from the adjacent first electrodes of the plurality of first electrodes 200 on two sides of the respective one of the plurality of barriers 600. For example, two sides of the respective one of the plurality of barriers 600 are respectively fully in direct contact with the adjacent first electrodes of the plurality of first electrodes 200. Optionally, a thickness of the respective one of the plurality of barriers 600 in the respectively one of the plurality of gaps G along the direction perpendicular to the first base substrate 100 is equal to or less than a distance between (1) the base substrate (e.g., the first base substrate 100 or the second base substrate 300) having the respective one of the plurality of barriers 600 disposed thereon and (2) the side of the first part 501 of the anisotropic conductive film 500 away from the electrode (one of the plurality of first electrode 200 or one of the plurality of second electrode 400) that is in direct contact with the respective one of the plurality of barriers 600. Optionally, the thickness of the respective one of the plurality of barriers 600 in the respectively one of the plurality of gaps G along the direction perpendicular to the first base substrate 100 is equal to or less than a distance between (1) the base substrate (e.g., the first base substrate 100 or the second base substrate 300) having the respective one of the plurality of barriers 600 disposed thereon and (2) the side of the first part 501 of the anisotropic conductive film 500 away from the base substrate having the respective one of the plurality of barriers 600 disposed thereon. Optionally, the thickness of the respective one of the plurality of barriers 600 in the respectively one of the plurality of gaps G along a direction perpendicular to the first base substrate 100 is equal to or less than a distance between a side of the first part 501 of the anisotropic conductive film 500 away from the first base substrate 100 and the first base substrate 100 along the direction perpendicular to the first base substrate 100. In the base substrate as shown in FIG. 2E, although two sides of the respective one of the plurality of barriers 600 is not spaced apart from the adjacent first electrodes of the plurality of first electrodes 200, the respective one of the plurality of barriers 600, however, does not block the anisotropic conductive film 500 from extending through the respective one of the plurality of gaps G, and the respective one of the barriers 600 in the respective one of the plurality of gaps G does not interfere with the overflow of the anisotropic conductive adhesive material from the space between the respective one of the plurality of first electrodes 200 and the respective one of the plurality of second electrodes 400 into the respective one of the plurality of gaps G during the bonding process. By having this design, it can be ensured that the respective one of the plurality of gaps G can be completely filled by the adhesive conductive material other than the space occupied by the respective one of the plurality of barriers 600. In FIG. 2E, in the respective one of the plurality of gaps G, the adhesive conductive material fills in a spaced formed by the respective one of the plurality of barriers 600, the second base substrate 300, and two adjacent second electrodes of the plurality of second electrodes 400.

As shown in FIGS. 2A to 2C, in some embodiments, a respective one of the plurality of barriers 600 is a single block. A longitudinal dimension of the single block is substantially parallel to a longitudinal dimension of a respective one of the plurality of first electrodes 200. For example, the longitudinal dimension of the single block and the longitudinal dimension of the respective one of the plurality of first electrodes 200 are substantially parallel to the first direction, e.g., the Z-direction. Optionally, the longitudinal dimension of the single block is substantially the same as the longitudinal dimension of the respective one of the plurality of first electrodes 200. The respective one of the plurality of barriers 600 is disposed between two adjacent barriers (single blocks) of the plurality of barriers 600, facilitating the adhesive conductive material fill in the respective one of the plurality of gaps G other than the space occupied by the respective one of the plurality of barriers 600.

Figure 2F:
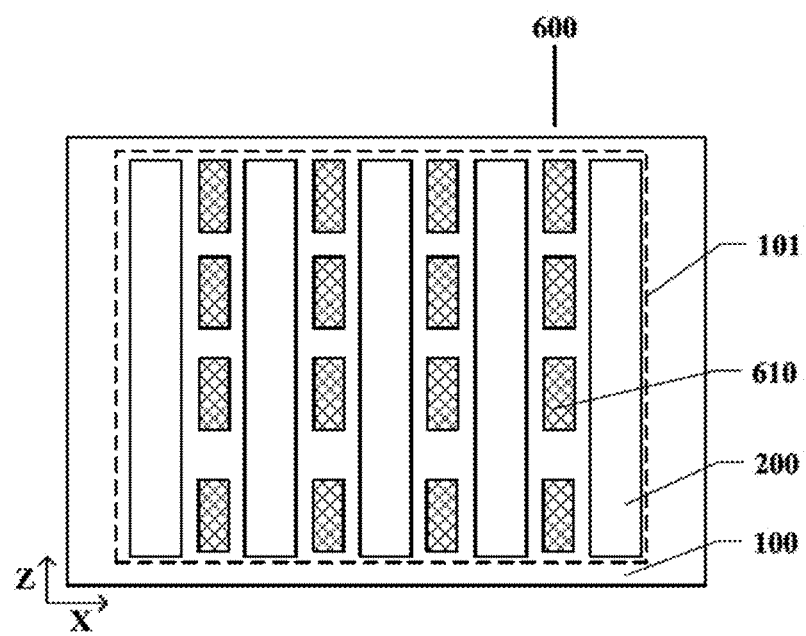
FIG. 2F is a plan view of a partial structure of a bonding area of a display substrate in some embodiments according to the present disclosure.

FIG. 2F is a plan view of a partial structure of a bonding area of a display substrate in some embodiments according to the present disclosure. Referring to FIG. 2F, in some embodiments, a respective one of the plurality of barriers 600 includes a plurality of sub-blocks 610 spaced apart from each other. The plurality of sub-blocks 610 of the respective one of the plurality of barriers 600 are arranged along a direction substantially parallel to a longitudinal dimension of a respective one of the plurality of first electrodes 200, e.g., along the first direction (the Z-direction). Optionally, the plurality of sub-blocks 610 of the respective one of the plurality of barriers 600 are evenly distributed along the first direction.

Figure 3A:
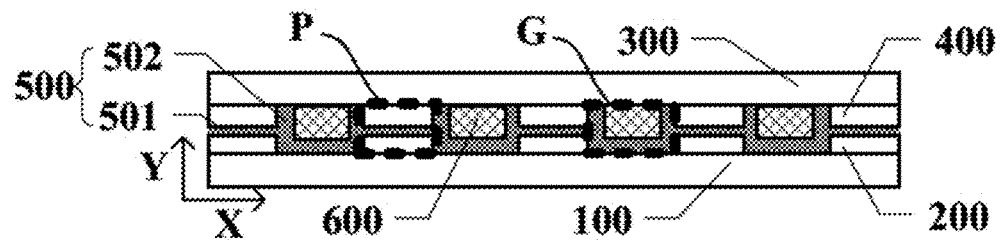
FIG. 3A is a cross-sectional view of a bonding area of a display substrate in some embodiments according to the present disclosure.
Figure 3B:
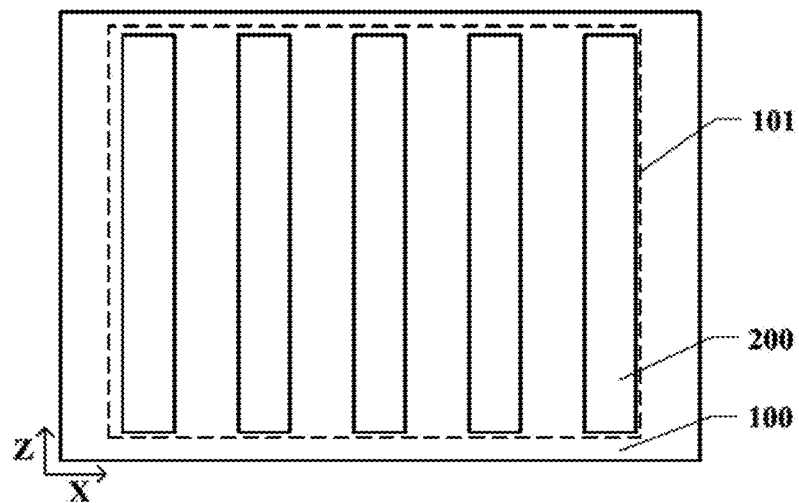
FIG. 3B is a plan view of a partial structure of a bonding area of a display substrate of FIG. 3A.
Figure 3C:
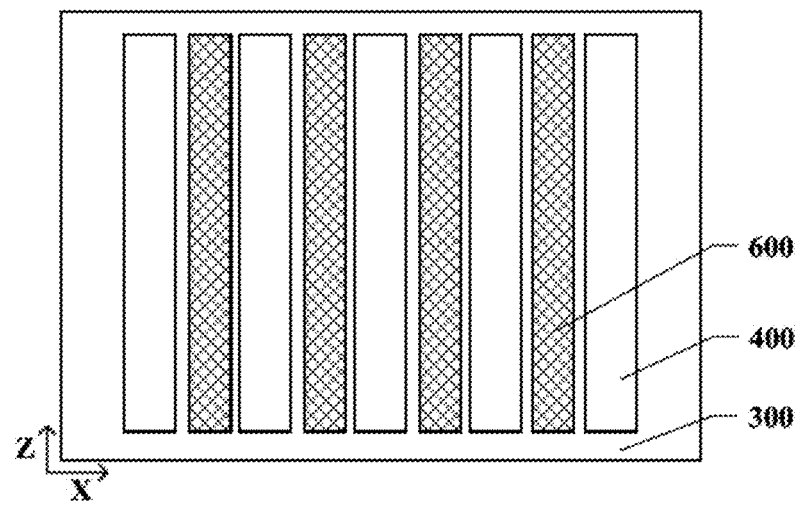
FIG. 3C is a plan view of a partial structure of a bonding area of a display substrate of FIG. 3A.

FIG. 3A is a cross-sectional view of a bonding area of a display substrate in some embodiments according to the present disclosure. FIG. 3B is a plan view of a partial structure of a bonding area of a display substrate of FIG. 3A. FIG. 3C is a plan view of a partial structure of a bonding area of a display substrate of FIG. 3A. Referring to FIGS. 3A to 3C, in some embodiments, the plurality of barriers 600 are disposed on the second base substrate 300, and are respectively in direct contact with the second base substrate 300.

Figure 4A:
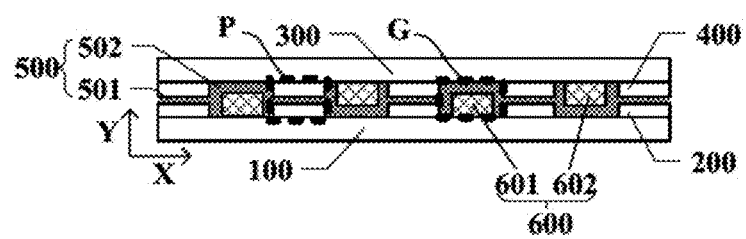
FIG. 4A is a cross-sectional view of a bonding area of a display substrate in some embodiments according to the present disclosure.
Figure 4B:
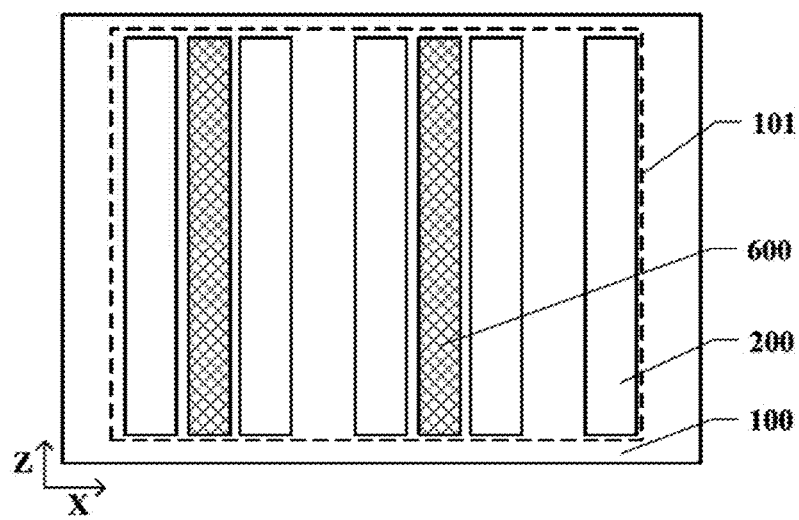
FIG. 4B is a plan view of a partial structure of a bonding area of a display substrate of FIG. 4A.
Figure 4C:
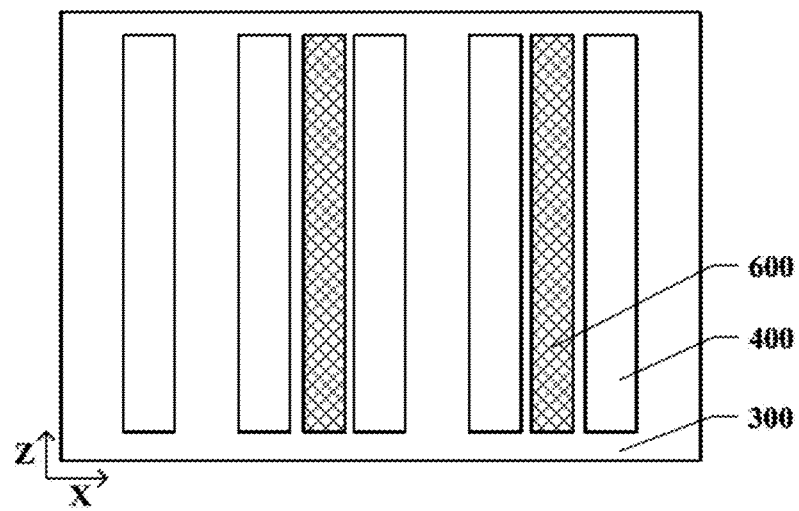
FIG. 4C is a plan view of a partial structure of a bonding area of a display substrate of FIG. 4A.

In some embodiments, the plurality of barriers includes a plurality of first barriers respectively in direct contact with the first base substrate and a plurality of second barriers respectively in direct contact with the second base substrate. FIG. 4A is a cross-sectional view of a bonding area of a display substrate in some embodiments according to the present disclosure. FIG. 4B is a plan view of a partial structure of a bonding area of a display substrate of FIG. 4A. FIG. 4C is a plan view of a partial structure of a bonding area of a display substrate of FIG. 4A. Referring to FIGS. 4A to 4C, the plurality of barriers 600 includes a plurality of first barriers 601 respectively in direct contact with the first base substrate 100 and a plurality of second barriers 602 respectively in direct contact with the second base substrate 300. In some embodiments, the plurality of first barriers 601 and the plurality of second barriers 602 are alternately disposed in the plurality of gaps G respectively. Any one of the plurality of first barriers 601 and any one of the plurality of second barriers 602 are disposed in different gaps of the plurality of gaps G. For example, any one of the plurality of first barriers 601 and any one of the plurality of second barriers 602 are not disposed in a same gap of the plurality of gaps G. Optionally, between adjacent pairs of the plurality of bound electrode pairs P, the display substrate includes a respective one of the plurality of first barriers 601, or a respective one of the plurality of second barriers 602, but not both. In FIG. 4A, two adjacent first barrier of the plurality of first barriers 601 are spaced apart by a single one of the plurality of second barriers 602, and two adjacent second barrier of the plurality of second barriers 602 are spaced apart by a single one of the plurality of first barriers 601.

Optionally, two adjacent first barrier of the plurality of first barriers 601 are spaced apart by multiple ones of the plurality of second barriers 602. Optionally, two adjacent second barrier of the plurality of second barriers 602 are spaced apart by multiple ones of the plurality of first barriers 601.

Figure 5A:
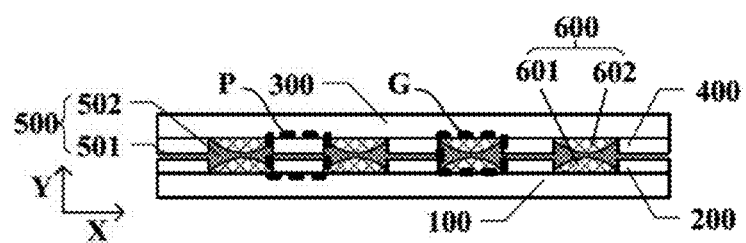
FIG. 5A is a cross-sectional view of a bonding area of a display substrate in some embodiments according to the present disclosure.
Figure 5B:
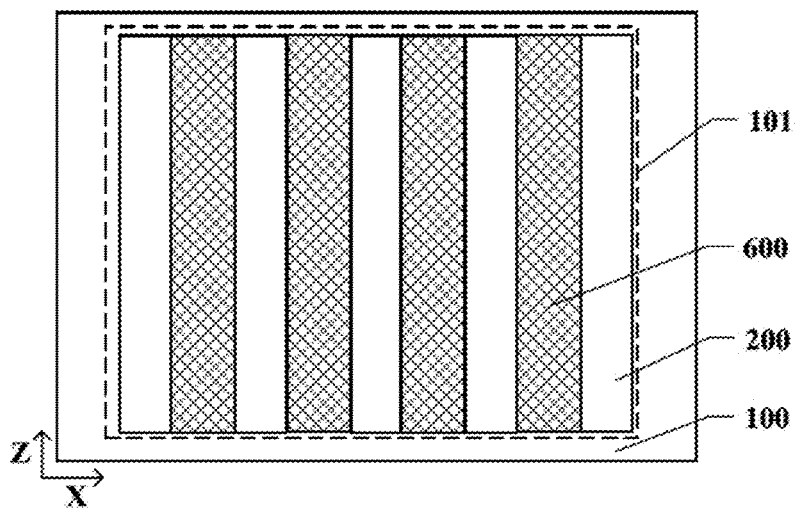
FIG. 5B is a plan view of a partial structure of a bonding area of a display substrate of FIG. 5A.
Figure 5C:
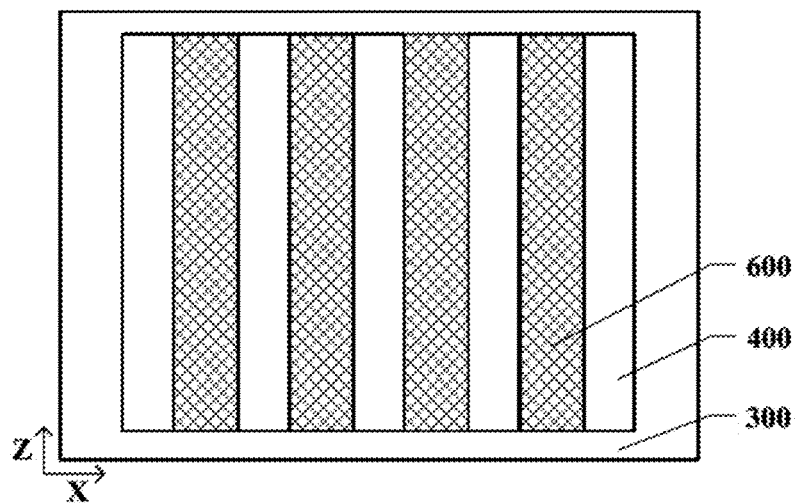
FIG. 5C is a plan view of a partial structure of a bonding area of a display substrate of FIG. 5A.

In some embodiments, a respective one of the plurality of first barriers and a respective one of the plurality of second barriers are in a same gap of the plurality of gaps. Optionally, orthographic projections of the respective one of the plurality of first barriers and the respective one of the plurality of second barriers in the same gap of the plurality of gaps at least partially overlap with each other. FIG. 5A is a cross-sectional view of a bonding area of a display substrate in some embodiments according to the present disclosure. FIG. 5B is a plan view of a partial structure of a bonding area of a display substrate of FIG. 5A. FIG. 5C is a plan view of a partial structure of a bonding area of a display substrate of FIG. 5A. Referring to FIGS. 5A to 5C, the plurality of barriers 600 includes a plurality of first barriers 601 respectively in direct contact with the first base substrate 100 and a plurality of second barriers 602 respectively in direct contact with the second base substrate 300. In some embodiments, a respective one of the plurality of first barriers 601 and a respective one of the plurality of second barriers 602 are in a same gap of the plurality of gaps G, and orthographic projections of the respective one of the plurality of first barriers 601 and the respective one of the plurality of second barriers 602 in the same gap of the plurality of gaps G at least partially overlap with each other.

In some embodiments, the display substrate includes, in a respective one of the plurality of gaps G, a respective one of the plurality of first barriers 601 on the first base substrate 100 and a respective one of the plurality of second barriers 602 on the second base substrate 300. Optionally, a sum of thicknesses of the respective one of the plurality of first barriers 601 and the respective one of the plurality of second barriers 602 in the same gap of the plurality of gaps G along a direction perpendicular to the first base substrate 100 is less than a distance between the first base substrate 100 and the second base substrate 300 along the direction perpendicular to the first base substrate 100. By having this design, the presence of the respective one of the barriers 600 in the respective one of the plurality of gaps G does not interfere with the bonding between the respective one of the plurality of first electrodes 200 and the respective one of the plurality of second electrodes 400, the adhesive conductive material of the anisotropic conductive film can overflow from the space between the respective one of the plurality of first electrodes 200 and the respective one of the plurality of second electrodes 400 into the respective one of the plurality of gaps G during the bonding process. In one example, the second part 502 is in a space formed by a respective one of the plurality of first barriers 601 and a respective one of the plurality of second barriers 602 in a respective one of the plurality of gaps G, facilitating the overflow of the adhesive conductive material of the anisotropic conductive film to completely fill in the respective one of the plurality of gaps G other than the space occupied by the respective one of the plurality of first barriers 601 and the respective one of the plurality of second barriers 602.

In some embodiments, along the second direction (e.g., the X-direction), the respective one of the plurality of first barriers 601 in the respectively one of the plurality of gaps G is spaced apart from the adjacent electrodes of the plurality of first electrodes 200 by the anisotropic conductive film 500 (e.g., by the second part 502 of the anisotropic conductive film 500 in a respective one of the plurality of gaps G), and the respective one of the plurality of second barriers 602 in the respectively one of the plurality of gaps G is spaced apart from the adjacent electrodes of the plurality of second electrodes 400 by the anisotropic conductive film 500 (e.g., by the second part 502 of the anisotropic conductive film 500 in a respective one of the plurality of gaps G). By having this design, it can be ensured that the adhesive conductive material of the anisotropic conductive film 500 can overflow from the space between the respective one of the plurality of first electrodes 200 and the respective one of the plurality of second electrodes 400 into the respective one of the plurality of gaps G during the bonding process, and that the respective one of the plurality of gaps G can be completely filled by the adhesive conductive material other than the space occupied by the respective one of the plurality of first barriers 601 and the respective one of the plurality of second barriers 602.

Figure 5D:
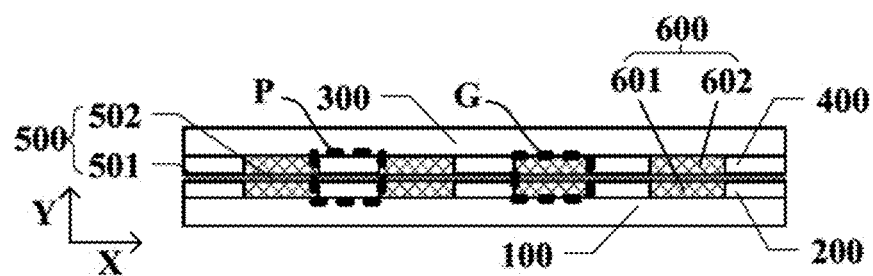
FIG. 5D is a cross-sectional view of a bonding area of a display substrate in some embodiments according to the present disclosure.

FIG. 5D is a cross-sectional view of a bonding area of a display substrate in some embodiments according to the present disclosure. Referring to FIG. 5D, a respective one of the plurality of first barriers 601 is in direct contact with adjacent first electrodes of the plurality of first electrodes 200. The respective one of the plurality of first barriers 601 is, however, not spaced apart from the adjacent first electrodes of the plurality of first electrodes 200 on two sides of the respective one of the plurality of barriers 600. For example, two sides of the respective one of the plurality of first barriers 601 are respectively fully in direct contact with the adjacent first electrodes of the plurality of first electrodes 200. Similarly, a respective one of the plurality of second barriers 602 is in direct contact with adjacent second electrodes of the plurality of second electrodes 400. The respective one of the plurality of second barriers 602 is, however, not spaced apart from the adjacent second electrodes of the plurality of second electrodes 400 on two sides of the respective one of the plurality of second barriers 602. For example, two sides of the respective one of the plurality of second barriers 602 are respectively fully in direct contact with the adjacent second electrodes of the plurality of second electrodes 400. Optionally, the thickness of the respective one of the plurality of first barriers 601 in the respectively one of the plurality of gaps G along a direction perpendicular to the first base substrate 100 is equal to or less than a distance between a side of the first part 501 of the anisotropic conductive film 500 away from the first base substrate 100 and the first base substrate 100 along the direction perpendicular to the first base substrate 100. Optionally, the thickness of the respective one of the plurality of second barriers 602 in the respectively one of the plurality of gaps G along the direction perpendicular to the first base substrate 100 is equal to or less than a distance between a side of the first part 501 of the anisotropic conductive film 500 away from the second base substrate 300 and the second base substrate 300 along the direction perpendicular to the second base substrate 300. By having this design, it can be ensured that the respective one of the plurality of gaps G can be completely filled by the adhesive conductive material other than the space occupied by the respective one of the plurality of first barriers 601 and the respective one of the plurality of second barriers 602.

In the base substrate as shown in FIG. 5D, two sides of the respective one of the plurality of first barriers 601 is not spaced apart from the adjacent first electrodes of the plurality of first electrodes 200, and two sides of the respective one of the plurality of second barriers 602 is not spaced apart from the adjacent second electrodes of the plurality of second electrodes 400. Nonetheless, the presence of the respective one of the plurality of first barriers 601 and the respective one of the plurality of second barriers 602 does not block the anisotropic conductive film 500 from extending through the respective one of the plurality of gaps G. The presence of the respective one of the plurality of first barriers 601 and the respective one of the plurality of second barriers 602 does not interfere with the overflow of the anisotropic conductive adhesive material from the space between the respective one of the plurality of first electrodes 200 and the respective one of the plurality of second electrodes 400 into the respective one of the plurality of gaps G during the bonding process. By having this design, it can be ensured that the respective one of the plurality of gaps G can be completely filled by the adhesive conductive material other than the space occupied by the respective one of the plurality of first barriers 601 and the respective one of the plurality of second barriers 602.

In another aspect, the present disclosure provides a display substrate having a bonding area for bonding with a circuit structure. In some embodiments, the display substrate includes a first base substrate; a plurality of first electrodes on the first base substrate and spaced apart from each other; and a barrier layer comprising a plurality of barriers respectively between adjacent first electrodes of the plurality of first electrodes.

In another aspect, the present disclosure provides a circuit structure having a bonding area for bonding with a display substrate. In some embodiments, the circuit structure includes a second base substrate; a plurality of second electrodes on the second base substrate and spaced apart from each other, and a barrier layer comprising a plurality of barriers respectively between adjacent second electrodes of the plurality of second electrodes. Optionally, the circuit structure is a driver integrated circuit. Optionally, the circuit structure is a printed circuit board. Optionally, the circuit structure is a chip-on-film.

Figure 6:
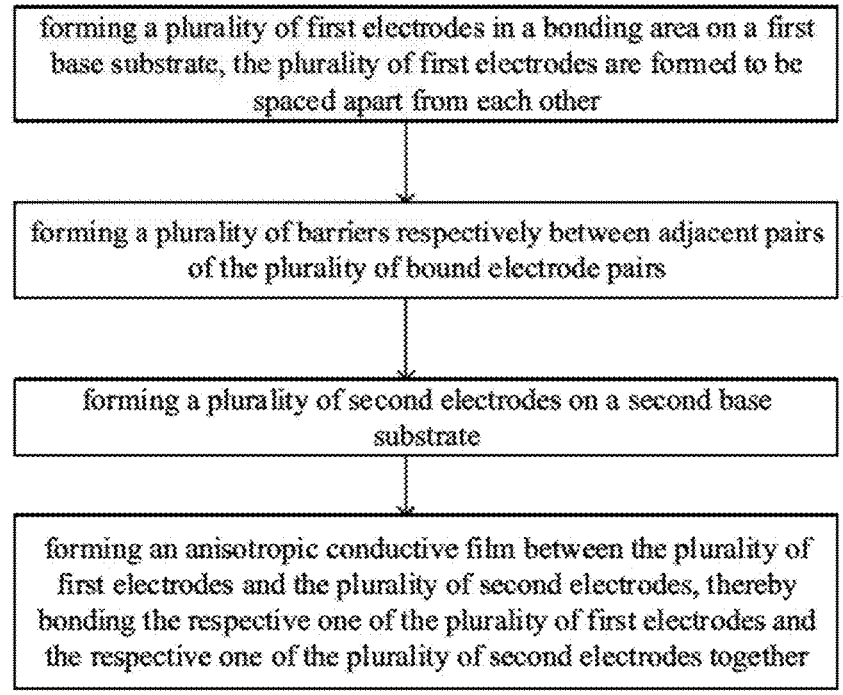
FIG. 6 is a flow chart illustrating a method of fabricating a display substrate in some embodiments according to the present disclosure.

In another aspect, the present disclosure provides a method of fabricating a display substrate. FIG. 6 is a flow chart illustrating a method of fabricating a display substrate in some embodiments according to the present disclosure. Referring to FIG. 6, in some embodiments, the method includes forming a plurality of first electrodes in a bonding area on a first base substrate, the plurality of first electrodes are formed to be spaced apart from each other; forming a plurality of barriers respectively between adjacent pairs of the plurality of bound electrode pairs; forming a plurality of second electrodes on a second base substrate; and forming an anisotropic conductive film between the plurality of first electrodes and the plurality of second electrodes, thereby bonding the respective one of the plurality of first electrodes and the respective one of the plurality of second electrodes together. Optionally, the anisotropic conductive film is formed to include a first part between the respective one of the plurality of first electrodes and the respective one of the plurality of second electrodes in the respective pair of a plurality of bound electrode pairs.

Optionally, the anisotropic conductive film is formed to further include a second part filling a respectively one of a plurality of gaps respectively between adjacent pairs of the plurality of bound electrode pairs other than a space occupied by the barrier layer. Optionally, the anisotropic conductive film is formed to further include a second part continuously extending through a respectively one of a plurality of gaps respectively between adjacent pairs of the plurality of bound electrode pairs. Optionally, the anisotropic conductive film is formed so that an orthographic projection of the second part of the anisotropic conductive film in the respectively one of the plurality of gaps on the first base substrate coven an orthographic projection of a respective one of the plurality of barriers in the respectively one of the plurality of gaps on the first base substrate.

Optionally, the barrier layer is formed so that a distance between the first base substrate and the second base substrate along a direction perpendicular to the first base substrate is greater than a thickness of the barrier layer in the respectively one of the plurality of gaps along the direction perpendicular to the first base substrate. Optionally, the barrier layer is formed so that the respective one of the plurality of barriers in the respectively one of the plurality of gaps is spaced apart from the adjacent pairs of the plurality of bound electrode pairs by the anisotropic conductive film. Optionally, the barrier layer is formed so that the respective one of the plurality of barriers in the respectively one of the plurality of gaps has a first width w1 along a direction across the adjacent pairs of the plurality of bound electrode pairs. The respectively one of the plurality of gaps along the direction across the adjacent pairs of the plurality of bound electrode pairs has a second width w2. Optionally, the first width w1 is in a range of approximately ⅓ to approximately ½ of the second width w2. Optionally, the barrier layer is formed so that the plurality of barriers are respectively in direct contact with the first base substrate. Optionally, the barrier layer is formed so that a respective one of the plurality of barriers is in direct contact with adjacent first electrodes of the plurality of first electrodes; and the respective one of the plurality of barriers in the respectively one of the plurality of gaps along a direction perpendicular to the first base substrate has a thickness t1. Optionally, the thickness t1 is equal to or less than a distance between (1) a side of the first part of the anisotropic conductive film away from the first base substrate and (2) the first base substrate, along the direction perpendicular to the first base substrate.

In some embodiments, forming the barrier layer includes forming a plurality of first barriers respectively in direct contact with the first base substrate and forming a plurality of second barriers respectively in direct contact with the second base substrate. Optionally, the plurality of first barriers and the plurality of second barriers are formed to be disposed alternately in the plurality of gaps, respectively. Optionally, any of the plurality of first barriers and any of the plurality of second barriers are formed in different gaps of the plurality of gaps. Optionally, a respective one of the plurality of first barriers and a respective one of the plurality of second barriers are formed in a same gap of the plurality of gaps; and orthographic projections of the respective one of the plurality of first barriers and the respective one of the plurality of second barriers in the same gap of the plurality of gaps at least partially overlap with each other.

In some embodiments, a respective one of the plurality of barriers is formed as a single block. Optionally, the respective one of the plurality of barriers is formed so that a longitudinal dimension of the single block is substantially parallel to a longitudinal dimension of a respective one of the plurality of first electrodes; and the longitudinal dimension of the single block is substantially the same as the longitudinal dimension of the respective one of the plurality of first electrodes.

In some embodiments, a respective one of the plurality of barriers is formed to include a plurality of sub-blocks spaced apart from each other. Optionally, the respective one of the plurality of barriers is formed so that the plurality of sub-blocks are arranged along a direction substantially parallel to a longitudinal dimension of a respective one of the plurality of first electrodes.

Figure 7:
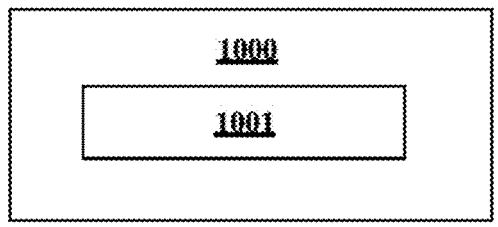
FIG. 7 is a schematic diagram illustrating a display apparatus in some embodiments according to the present disclosure.

In another aspect, the present disclosure provides a display apparatus having the display substrate described herein or fabricated by a method described herein. Optionally, the display apparatus further includes one or more integrated circuits connected to the display substrate. Optionally, the display apparatus is a liquid crystal display apparatus. Optionally, the display apparatus is an organic light emitting diode display apparatus. Optionally, the display apparatus is a touch control display apparatus. FIG. 7 is a schematic diagram illustrating a display apparatus in some embodiments according to the present disclosure. Referring to FIG. 7, the display apparatus 1000 includes the display substrate 1001 described herein or fabricated by a method described herein.

Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a bonding area for bonding with a circuit structure, comprising:
a plurality of first electrodes and a plurality of second electrodes in the bonding area, a respective one of the plurality of first electrodes being bound to a respective one of the plurality of second electrodes thereby forming a respective pair of a plurality of bound electrode pairs in the bonding area;
a barrier layer comprising a plurality of barriers respectively between adjacent pairs of the plurality of bound electrode pairs;
an anisotropic conductive film for bonding the respective one of the plurality of first electrodes and the respective one of the plurality of second electrodes together; and
a first base substrate and a second base substrate facing the first base substrate;
wherein the plurality of first electrodes are on the first base substrate;
the plurality of second electrodes are on the second base substrate; wherein the plurality of barriers comprise:
a plurality of first barriers respectively in direct contact with the first base substrate, and spaced apart from the second base substrate; and
a plurality of second barriers respectively in direct contact with the second base substrate and spaced apart from the first base substrate,
wherein the plurality of first barriers and the plurality of second barriers are alternately in a plurality of gaps respectively in a staggered fashion;
any of the plurality of first barriers and any of the plurality of second barriers are in different gaps of the plurality of gaps respectively between adjacent pairs of the plurality of bound electrode pairs;
the plurality of first barriers are absent in a gap having a respective one of the plurality of second barriers;
the plurality of second barriers are absent in a gap having a respective one of the plurality of first barriers,
two adjacent first gaps having two adjacent first barriers of the plurality of first barriers are spaced apart by an individual second gap having an individual second barrier of the plurality of second barriers, the individual second gap is absent of any first barrier; and
two adjacent second gaps having two adjacent second barriers of the plurality of second barriers are spaced apart by an individual first gap having an individual first barrier of the plurality of first barriers, the individual first gap is absent of any second barrier.

2. The display substrate of claim 1, wherein the anisotropic conductive film comprises a first part between the respective one of the plurality of first electrodes and the respective one of the plurality of second electrodes in the respective pair of a plurality of bound electrode pairs.

3. The display substrate of claim 2, wherein the anisotropic conductive film further comprises a second part filling a respectively one of the plurality of gaps respectively between adjacent pairs of the plurality of bound electrode pairs other than a space occupied by the barrier layer.

4. The display substrate of claim 2, wherein the anisotropic conductive film comprises a second part continuously extending through the respectively one of a plurality of gaps respectively between adjacent pairs of the plurality of bound electrode pairs.

5. The display substrate of claim 4, further comprising a first base substrate and a second base substrate facing each other;
wherein the plurality of first electrodes are on the first base substrate;
the plurality of second electrodes are on the second base substrate; and
an orthographic projection of the second part of the anisotropic conductive film in the respectively one of the plurality of gaps on the first base substrate covers an orthographic projection of a respective one of the plurality of barriers in the respectively one of the plurality of gaps on the first base substrate.

6. The display substrate of claim 4, further comprising a first base substrate and a second base substrate facing each other;
wherein the plurality of first electrodes are on the first base substrate;
the plurality of second electrodes are on the second base substrate; and
a distance between the first base substrate and the second base substrate along a direction perpendicular to the first base substrate is greater than a thickness of the barrier layer in the respectively one of the plurality of gaps along the direction perpendicular to the first base substrate.

7. The display substrate of claim 3, wherein the respective one of the plurality of barriers in the respectively one of the plurality of gaps is spaced apart from the adjacent pairs of the plurality of bound electrode pairs by the anisotropic conductive film.

8. The display substrate of claim 7, wherein a width of the respective one of the plurality of barriers in the respectively one of the plurality of gaps along a direction across the adjacent pairs of the plurality of bound electrode pairs is in a range of approximately 1/3 to approximately 1/2 of a width of the respectively one of the plurality of gaps along the direction across the adjacent pairs of the plurality of bound electrode pairs.

9. The display substrate of claim 4, further comprising a first base substrate and a second base substrate facing each other;
wherein the plurality of first electrodes are on the first base substrate;
the plurality of second electrodes are on the second base substrate; and
the plurality of barriers are respectively in direct contact with the first base substrate.

10. The display substrate of claim 9, wherein a respective one of the plurality of barriers is in direct contact with adjacent first electrodes of the plurality of first electrodes; and
a thickness of the respective one of the plurality of barriers in the respectively one of the plurality of gaps along a direction perpendicular to the first base substrate is equal to or less than a distance between a side of the first part of the anisotropic conductive film away from the first base substrate and the first base substrate along the direction perpendicular to the first base substrate.

11. The display substrate of claim 1, wherein a respective one of the plurality of barriers is a single block;

a longitudinal dimension of the single block is substantially parallel to a longitudinal dimension of a respective one of the plurality of first electrodes; and the longitudinal dimension of the single block is substantially the same as the longitudinal dimension of the respective one of the plurality of first electrodes.

12. The display substrate of claim 1, wherein a respective one of the plurality of barriers comprises a plurality of sub-blocks spaced apart from each other; and the plurality of sub-blocks are arranged along a direction substantially parallel to a longitudinal dimension of a respective one of the plurality of first electrodes.

13. The display substrate of claim 4, wherein the plurality of first electrodes are on the first base substrate;

the plurality of second electrodes are on the second base substrate; and the first base substrate and the second base substrate are two different ones selected from a group consisting of a back plate of an array substrate or a touch substrate, a base substrate of a driver integrated circuit, and a base substrate of a chip-on-film.

14. A display apparatus, comprising the display substrate of claim 1.

15. The display substrate of claim 1, wherein the barrier layer is made of an insulating material;

two sides of a respective one of the plurality of first barriers are respectively in direct contact with adjacent first electrodes of the plurality of first electrodes; and two sides of a respective one of the plurality of second barriers are respectively fully in direct contact with adjacent second electrodes of the plurality of second electrodes.

* * * * *

UNITED STATES PATENT AND TRADEMARK OFFICE
CERTIFICATE OF CORRECTION

PATENT NO. : 11,538,833 B2  
APPLICATION NO. : 16/484763  
DATED : December 27, 2022  
INVENTOR(S) : Jiang et al.

Page 1 of 1

It is certified that error appears in the above-identified patent and that said Letters Patent is hereby corrected as shown below:

On the Title Page

Item (73) Assignees, please correct to read as follows:
Chengdu BOE Optoelectronics Technology Co., Ltd., Sichuan (CN); BOE Technology Group Co., Ltd., Beijing (CN)

Signed and Sealed this  
Twelfth Day of September, 2023

Katherine Kelly Vidal  
*Director of the United States Patent and Trademark Office*